US008550702B2

United States Patent
Campbell et al.

(10) Patent No.: US 8,550,702 B2
(45) Date of Patent: Oct. 8, 2013

(54) CALIBRATED AIRFLOW SENSOR FACILITATING MONITORING OF ELECTRONIC SYSTEM COOLING

(75) Inventors: Levi A. Campbell, Poughkeepsie, NY (US); Thomas C. Long, Poughkeepsie, NY (US); Robert B. Schlak, Hyde Park, NY (US); Peter A. Wendling, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 10 days.

(21) Appl. No.: 13/285,014

(22) Filed: Oct. 31, 2011

(65) Prior Publication Data

US 2013/0107905 A1    May 2, 2013

(51) Int. Cl.
*G01K 3/02* (2006.01)
*G01F 1/68* (2006.01)
*G06F 1/20* (2006.01)
*H05K 7/20* (2006.01)
*H02P 7/00* (2006.01)
*H02P 31/00* (2006.01)

(52) U.S. Cl.
USPC .............................. 374/1; 73/204.11; 318/471

(58) Field of Classification Search
USPC ............... 374/1, 164, 166, 137, 29, 109, 110, 374/112, 114, 115, 163
See application file for complete search history.

(56) References Cited

U.S. PATENT DOCUMENTS

| 4,667,480 | A |   | 5/1987 | Bessler |
| 5,075,606 | A | * | 12/1991 | Lipman ................ 318/400.08 |
| 5,963,424 | A |   | 10/1999 | Hileman et al. |
| 6,005,762 | A |   | 12/1999 | Hiroi |
| 6,396,231 | B1 |   | 5/2002 | Horng et al. |
| 6,414,843 | B1 |   | 7/2002 | Takeda |
| 6,428,282 | B1 |   | 8/2002 | Langley |
| 6,487,463 | B1 | * | 11/2002 | Stepp, III ..................... 700/79 |
| 6,617,815 | B1 |   | 9/2003 | Krief |
| 6,654,894 | B2 | * | 11/2003 | Kaminski et al. ............ 713/300 |

(Continued)

FOREIGN PATENT DOCUMENTS

FR    2487973 A1    2/1982

OTHER PUBLICATIONS

Search Report issued by the Great Britain Intellectual Property Office (IPO) for GB Application No. 1216688.0, dated Jan. 21, 2013.

*Primary Examiner* — Lisa Caputo
*Assistant Examiner* — Brandi N Hopkins
(74) *Attorney, Agent, or Firm* — Dennis Jung, Esq.; Kevin P. Radigan, Esq.; Heslin Rothenberg Farley & Mesiti P.C.

(57) ABSTRACT

A calibrated airflow sensor and monitoring method are provided. The monitoring method which includes: providing an airflow sensor positioned within an electronic system to be at least partially air-cooled, the airflow sensor including at least one temperature sensor and a heater associated with one temperature sensor of the at least one temperature sensor; calibrating, with the airflow sensor positioned within the electronic system, a duty cycle for use in powering the heater associated with the one temperature sensor; and providing a controller configured to use the calibrated duty cycle in powering the heater of the temperature sensor during airflow monitoring of the electronic system, and to obtain a hot temperature ($T_{hot}$) reading from the one temperature sensor having the associated heater, and to determine, based at least in part on the hot temperature ($T_{hot}$) reading, whether to issue an airflow warning.

6 Claims, 9 Drawing Sheets

(56) References Cited

U.S. PATENT DOCUMENTS

| | | | |
|---|---|---|---|
| 6,873,929 B2 * | 3/2005 | Lai et al. | 702/132 |
| 7,194,646 B1 | 3/2007 | Watts, Jr. | |
| 7,698,095 B2 * | 4/2010 | Chung et al. | 702/151 |
| 7,757,506 B2 | 7/2010 | Ellsworth, Jr. et al. | |
| 7,768,222 B2 * | 8/2010 | Ahladas et al. | 318/471 |
| 2002/0101715 A1 | 8/2002 | Osecky et al. | |
| 2003/0011984 A1 | 1/2003 | Chu et al. | |
| 2004/0139256 A1 | 7/2004 | Lee | |
| 2005/0244263 A1 | 11/2005 | Hardt et al. | |
| 2006/0133032 A1 | 6/2006 | Uchida et al. | |
| 2007/0081800 A1 | 4/2007 | Hsiang et al. | |
| 2007/0096665 A1 | 5/2007 | Ku et al. | |
| 2008/0170947 A1 | 7/2008 | Sutardja | |
| 2009/0086432 A1 | 4/2009 | Campbell et al. | |

\* cited by examiner

CALIBRATED AIRFLOW SENSOR FACILITATING MONITORING OF ELECTRONIC SYSTEM COOLING

STATEMENT REGARDING FEDERALLY FUNDED RESEARCH

This invention was made with government support under Contract No. HR0011-07-9-0002, awarded by the Defense Advanced Research Projects Agency (DARPA) of the U.S. Government. Accordingly, the U.S. Government has certain rights in the invention.

BACKGROUND

The power dissipation of integrated circuit chips, and the modules containing the chips, continues to increase in order to achieve increases in processor performance. This trend poses a cooling challenge at both module and system levels. Increased airflow rates are often needed to effectively cool high power modules and to limit the temperature of the air that is exhausted into the computer center.

In many large server applications, processors along with their associated electronics (e.g., memory, disk drives, power supplies, etc.) are packaged in removable drawer configurations stacked within a rack or frame. In other cases, the electronics may be in fixed locations within the rack or frame. Typically, the components are cooled by air moving in parallel airflow paths, usually front-to-back, impelled by one or more air moving devices (e.g., fans or blowers). In some cases it may be possible to handle increased power dissipation within a single drawer by providing greater airflow, through the use of a more powerful air moving device or by increasing the rotational speed (i.e., RPMs) of an existing air moving device. However, this approach may become problematic at the rack level in the context of a computer installation (i.e., data center).

The sensible heat load carried by the air exiting the rack may stress the capability of the room air-conditioning to effectively handle the load. This is especially true for large installations with "server farms" or large banks of computer racks located close together. In such installations, supplemental liquid cooling (e.g., water or refrigerant cooling) is an attractive technology to manage the higher heat fluxes. The liquid absorbs the heat dissipated by the components/modules in an efficient manner. Typically, the heat is ultimately transferred from the liquid to an outside environment, whether air or liquid cooled.

BRIEF SUMMARY

In one aspect, provided herein is a method which includes: providing an airflow sensor positioned within an electronic system to be cooled, the airflow sensor comprising at least one temperature sensor and a heater associated with one temperature sensor of the at least one temperature sensor; calibrating, with the airflow sensor positioned within the electronic system, a duty cycle for use in powering the heater associated with the one temperature sensor of the at least one temperature sensor; and providing a controller, the controller being configured to use the calibrated duty cycle in powering the heater associated with the one temperature sensor of the at least one temperature sensor during airflow monitoring of the electronic system, and to obtain a hot temperature ($T_{hot}$) reading from the temperature sensor having the associated heater powered using the calibrated duty cycle, and to determine, based at least in part on the hot temperature ($T_{hot}$) reading, whether to issue a warning.

In another aspect, an airflow monitoring method is provided which includes: employing an airflow sensor positioned within an electronic system to be cooled, the airflow sensor comprising at least one temperature sensor and a heater associated with one temperature sensor of the at least one temperature sensor. The employing includes: obtaining a calibrated duty cycle for use in powering the heater associated with the one temperature sensor of the at least one temperature sensor; using the calibrated duty cycle in powering the heater associated with the one temperature sensor of the at least one temperature sensor; obtaining a hot temperature ($T_{hot}$) reading from the one temperature sensor having the associated heater being powered using the calibrated duty cycle; and determining, based at least in part on the hot temperature ($T_{hot}$) reading, whether to issue a warning.

In a further aspect, a monitored electronic system is provided which includes an electronic system at least partially air-cooled, and a monitoring device for monitoring air-cooling of the electronic system. The monitoring device includes an airflow sensor, non-volatile memory, and a controller. The airflow sensor is positioned within the electronic system, and includes at least one temperature sensor and a heater associated with one temperature sensor of the at least one temperature sensor. The non-volatile memory contains a calibrated duty cycle for use in powering the heater associated with the one temperature sensor, with the calibrated duty cycle having been obtained with the airflow sensor positioned within the electronic system. The controller is configured to use the calibrated duty cycle in powering the heater associated with the one temperature sensor of the at least one temperature sensor during airflow monitoring of the electronic system, and to obtain a hot temperature ($T_{hot}$) reading from the one temperature sensor having the associated heater powered using the calibrated duty cycle, and to determine, based at least in part on the hot temperature ($T_{hot}$) reading, whether to issue a warning.

Additional features and advantages are realized through the techniques of the present invention. Other embodiments and aspects of the invention are described in detail herein and are considered a part of the claimed invention.

BRIEF DESCRIPTION OF THE SEVERAL VIEWS OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

DETAILED DESCRIPTION

As used herein, the terms "electronics rack", "rack-mounted electronic equipment", and "rack unit" are used interchangeably, and unless otherwise specified include any housing, frame, rack, compartment, blade server system, etc., having one or more heat generating components of a computer system or electronics system, and may be, for example, a stand-alone computer processor having high, mid or low end processing capability. In one embodiment, an electronics rack may comprise one or more electronic systems, each having one or more heat generating components disposed therein requiring cooling. "Electronic system" refers to any housing, blade, book, drawer, node, compartment, etc., having one or more heat generating electronic components disposed therein. Each electronic system of an electronics rack may be movable or fixed relative to an electronics rack, with the nodes of an IBM® Power® 775™ Supercomputer being one example of electronic systems of an electronics rack to be cooled. (IBM®, Power®, Power 775™ are trademarks of International Business Machines Corporation, Armonk, N.Y., USA.) Further, "data center" refers to a computer installation containing one or more electronics racks to be cooled. As a specific example, a data center may include one or more rows of rack-mounted computing units.

Reference is made below to the drawings, which are not drawn to scale for ease of understanding, wherein the same reference numbers used throughout different figures designate the same or similar components.

Figure 1:
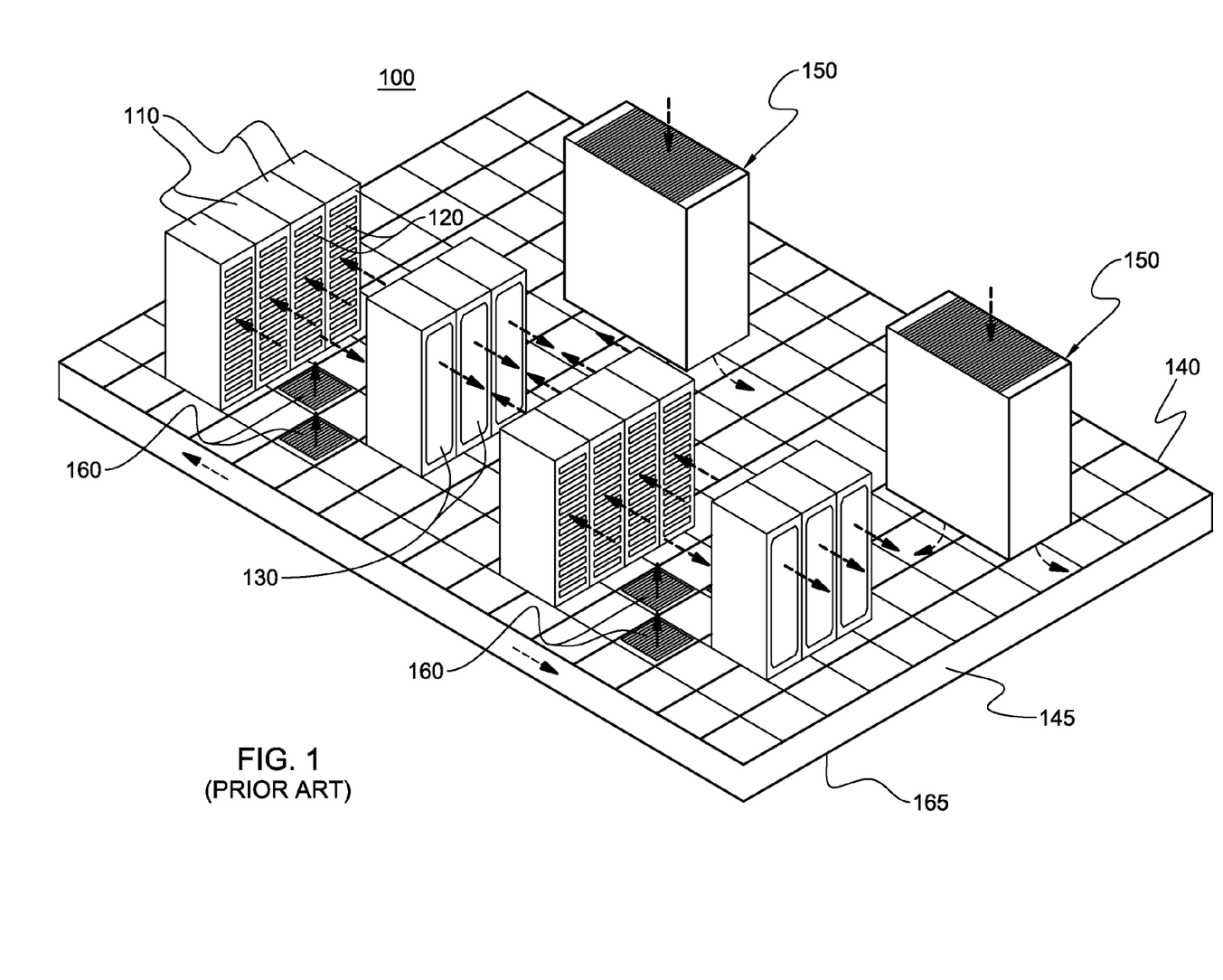
FIG. 1 depicts one embodiment of a conventional raised floor layout of an air-cooled data center.

FIG. 1 depicts a raised floor layout of an air cooled data center 100 typical in the prior art, wherein multiple electronics racks 110 are disposed in one or more rows. A data center such as depicted in FIG. 1 may house several hundred, or even several thousand microprocessors. In the arrangement illustrated, chilled air enters the computer room via perforated floor tiles 160 from a supply air plenum 145 defined between the raised floor 140 and a base or sub-floor 165 of the room. Cooled air is taken in through louvered or screened doors at air inlet sides 120 of the electronics racks and expelled through the backs or air outlet sides 130 of the electronics racks. Each electronics rack 110 may have one or more air-moving devices (e.g., fan or blower) to provide forced inlet-to-outlet airflow to cool the electronic components within the electronic system(s) of the rack. The supply air plenum 145 provides conditioned and cooled air to the air-inlet sides of the electronics racks via perforated floor tiles 160 disposed in a "cold" aisle of the computer installation. The conditioned and cooled air is supplied to plenum 145 by one or more air-conditioning units 150, also disposed within the data center 100. Room air is taken into each air-conditioning unit 150 near an upper portion thereof. This room air may comprise (in part) exhausted air from the "hot" aisles of the computer installation defined, for example, by opposing air outlet sides 130 of electronics racks 110.

Figure 2:
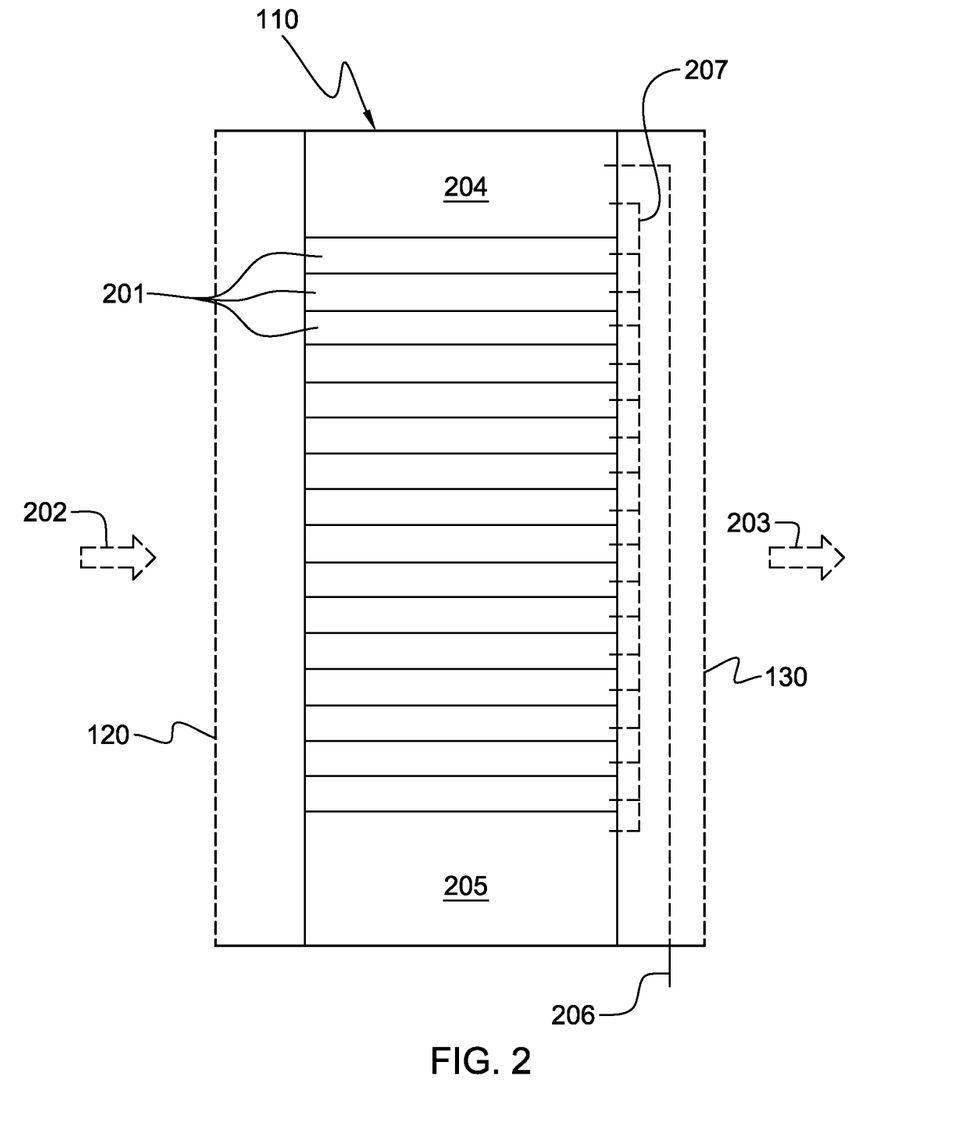
FIG. 2 is a cross-sectional elevational view of one embodiment of an electronics rack comprising multiple electronic systems, one or more of which may be monitored employing a calibrated airflow sensor, in accordance with one or more aspects of the present invention.

FIG. 2 is an elevational representation of one embodiment of an electronics rack 110, shown comprising a plurality of electronic systems 201, which (in the embodiment illustrated), are a least partially air-cooled by cool air 202 ingressing via louvered air inlet door 120, and exhausting out louvered air outlet door 130 as hot air 203. Electronics rack 110 also includes one or more bulk power assemblies 204 of the AC-to-DC power supply assembly. AC-to-DC power supply assembly may further include, in one embodiment, a frame controller, which may be resident in the bulk power assembly 204 and/or in one or more electronic systems 201. Each electronic system 201 includes, in one example, one or more processors and associated memory. Also illustrated in FIG. 2 is one or more input/output (I/O) drawer(s) 205, which may also include a switch network. I/O drawer(s) 205 may include, for example, PCI card slots and disk drivers for the electronics rack.

A three-phase AC source feeds power via an AC power supply line cord 206 to bulk power assembly 204, which transforms the supplied AC power to an appropriate DC power level for output via distribution cable 207 to the plurality of electronic systems 201 and I/O drawer(s) 205. The number of electronic systems installed in the electronics rack is variable and depends on customer requirements for a particular system. Further, the configuration of the bulk power assembly of the AC-to-DC power supply assembly is variable and is determined, in one implementation, by the number of electronic systems installed in the electronics rack, or more particularly, by the power requirements of the common load of the electronics rack being fed by the AC-to-DC power supply assembly.

Figure 3:
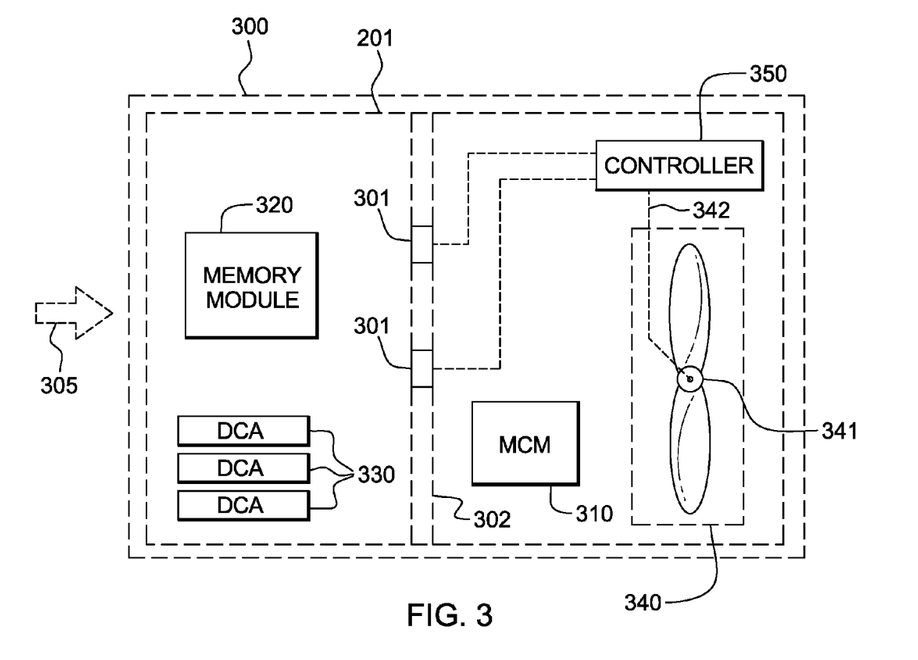
FIG. 3 is a schematic of one embodiment of an electronic system with one or more airflow sensors, and shown disposed within a calibration environment for undergoing calibration of airflow measurement sensing, in accordance with one or more aspects of the present invention.

FIG. 3 is a schematic of one embodiment of electronic system 201 of FIG. 2, and illustrates one embodiment of an air-moving device 340 and an automated controller 350 associated therewith, in accordance with an aspect of the present invention. As illustrated, electronic system 201 may include one or more multi-chip modules (MCM) 310, which may be liquid-cooled, employing one or more liquid-cooled cold plates (not shown). Supporting electronics for multi-chip module 310 include one or more memory modules 320, such as one or more DIMMs, and one or more subsystem power supplies, such as the three distributed converter assembly (DCA) supplies 330 illustrated.

As shown in FIG. 3, air-moving device 340 includes an air-moving blade assembly, typically driven by a motor 341 at a normal operating rotational velocity. The rotational velocity of an air-moving device within an electronics rack is conventionally set by the rack manufacturer to account for a variety of anticipated ambient temperature, altitude, heat load, configuration and motor variations, which taken together effect the safe, operating rotational velocity of the air-moving device.

The heat produced by the electronic components within the electronic system must be transported away to avoid damage to the components. A controller 350 is provided to monitor temperature within the electronic system and to, for example, dynamically adjust speed or rotation of motor 341 of air-moving device 340 via, for example, a control line 342 between controller 350 and motor 341. Thermal sensing can be accomplished via one or more temperature sensors 301 (such as thermistors) disposed, for example, within electronic system 201. Note in this regard, that although described herein with reference to electronic system 201, the thermal sensing and calibration processes presented are equally applicable to monitoring airflow cooling of any electronic system, such as a bulk power assembly 204 (see FIG. 2) or I/O drawer 205 (see FIG. 2) of an electronics rack, as well as any other at least partially air-cooled electronic system.

As described herein, thermal sensing may be in the form of thermistors, thermocouples, RTDs, or temperature sensing diodes, etc. applied to various electronics within the electronic system to be cooled, and one or more of the sensed temperatures are compared, in one example, to one or more thresholds by a controller executing within or coupled to the electronic system, to provide both a means to shut down the electronic system to prevent damage, as well as a feedback control signal to increase cooling (for example, by increasing a fan speed). In an ideal implementation, all critical components within the electronic system or enclosure have thermal sensing and damage protection as described herein associated with them. However, certain components within the system may not be configured for easy application of thermal sensing. Air cooling of such components is necessarily inferred by looking at temperatures in other locations within the electronic system/enclosure, or by sensing the air flow through the electronic system/enclosure. In the example of FIG. 3, airflow sensors 301 are disposed, for example, on a printed circuit board 302 positioned within the electronic system 201 for sensing airflow 305 across electronic system 201. As explained further below, in one embodiment, airflow sensors 301 are initially calibrated within a calibration environment or system 300 comprising a controlled calibration environment with a known ambient temperature and known ambient airflow 305 across the electronic system 201.

Figure 4:
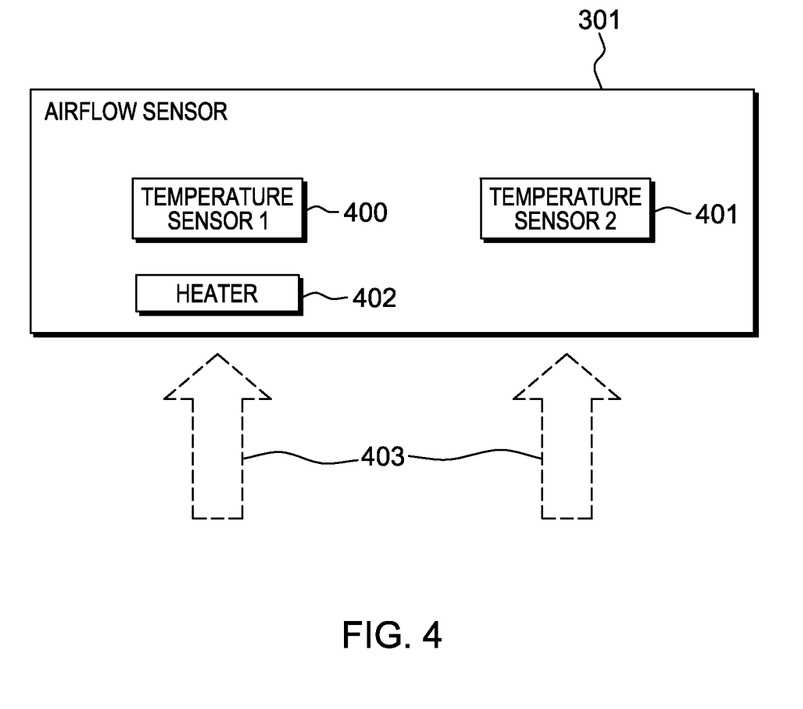
FIG. 4 is a schematic of one embodiment of an airflow sensor to be employed as a monitoring device, in accordance with one or more aspects of the present invention.

By way of example, airflow sensor 301 comprises, in one embodiment, at least one temperature sensor, and at least one heater associated with one temperature sensor of the at least one temperature sensor. FIG. 4 depicts one embodiment of such an airflow sensor 301, wherein a first temperative sensor 400 has associated therewith one or more heaters 402, and offset from temperature sensor 400 is a second temperature sensor 401. Note that in alternate embodiments, multiple heaters could be associated with first temperature sensor 400, for example, on either side of the sensor, or still further, a single temperature sensor could be employed in obtaining the hot temperature ($T_{hot}$) and ambient temperature ($T_{amb}$) readings discussed herein.

As one example, heater 402 is a resistor, and in operation, current flowing through the resistor dissipates heat, which raises the temperature of temperature sensor 400 above the ambient airflow 403 temperature read by second temperature sensor 401. The hot temperature ($T_{hot}$) of temperature sensor 400 above that of second temperature sensor 401 is a function of the rate of airflow across the sensors 400, 401 and heater 402. In one implementation, the ambient temperature ($T_{amb}$) is available through, for example, second temperature sensor 401. In those cases where component density within the electronic system or enclosure results in temperature sensors being placed within the enclosure where they could be affected by the total heat dissipation within the electronic system, it may be desirable to employ a single temperature sensor in obtaining a high, hot level reading and a low, ambient reading.

Complications arise in monitoring airflow and cooling of an electronic system due to variabilities between the airflow sensors and the operation of airflow sensors between systems. For example, there can be variability in the power delivered to the heaters (e.g., resistors), the tolerance of the heaters themselves, the tolerance of the temperature sensors (e.g., thermistors) and the associated temperature measurements, as well as variability from specific electronic system/enclosure-to-electronic system/enclosure. Disclosed herein therefore, in one aspect, are approaches for calibrating an airflow sensor, and for measuring airflow within the electronic system using the calibrated airflow sensor to facilitate monitoring cooling of the electronic system and, for example, automated deactivation of the electronic system based upon an identified cooling error.

Generally stated, disclosed herein is a method which includes providing an airflow sensor positioned within an electronic system to be cooled, wherein the airflow sensor includes at least one temperature sensor and a heater associated with one temperature sensor of the at least one temperature sensor. A calibrated duty cycle is also provided for powering the heater associated with the one temperature sensor, and a controller is coupled to the airflow sensor for reading temperatures from the airflow sensor. The controller employs the calibrated duty cycle in powering the heater associated with the one temperature sensor, and obtains a hot temperature ($T_{hot}$) reading from the one temperature sensor having the associated heater powered using the calibrated duty cycle. The controller determines, based at least in part on the hot temperature ($T_{hot}$) reading, whether to issue an airflow warning, or whether to take other action, such as increasing speed of an air-moving device, or deactivating the associated electronic system. A detailed embodiment for calibrating the duty cycle for the airflow sensor positioned within the electronic system is also described. As noted, by calibrating the duty cycle, greater confidence in the accuracy of the monitoring disclosed is obtained. In one embodiment, by comparing the hot temperature ($T_{hot}$) reading with an ambient temperature ($T_{amb}$) reading, airflow rate through the electronic system can be inferred, and compared to one or more threshold values which may be used, for example, to increase the RPMs of the one or more air-moving devices of the electronic system, issue airflow warnings, and/or deactivate power to the electronic system.

In the example of FIG. 4, the airflow sensor may comprise standard, surface-mount components on an electronics board, such as a printed circuit board. Relevant characteristics of such a sensor include:

the printed circuit board under the temperature sensor(s) (e.g., thermistor(s)) may be damaged if the temperature of the heater exceeds the board rating, so an upper limit to the heater temperature restricts the sensitivity of the sensor;

the temperature sensor and associated analog-to-digital converter components result in an approximately +/−4° C. uncertainty in the temperature readings;

the transient response of the sensor is dominated by the printed circuit board since the main path for heat to flow from the heater (e.g., resistor) to the associated temperature sensor (e.g., thermistor) is through the board;

the heat transfer from (for example) the thermistor(s), resistor(s) and board to air is a function of airflow rate, such that a higher airflow rate results in a smaller temperature difference between the hot temperature ($T_{hot}$) reading and the ambient air temperature ($T_{amb}$);

even if 1% tolerance resistors are employed, there is unit-to-unit variability in the power dissipated at a given duty cycle;

variability in the resistor (or heater) source voltage results in a variation in the power dissipation ($Q=V^2/R$); and calibration is desirable to achieve sensor performance in the two critical temperatures, that is, the sensor must not indicate low airflow when sufficient airflow is present (that is, no false trips), and the sensor must indicate low airflow when the enclosure is at risk of overheating.

Figure 5:
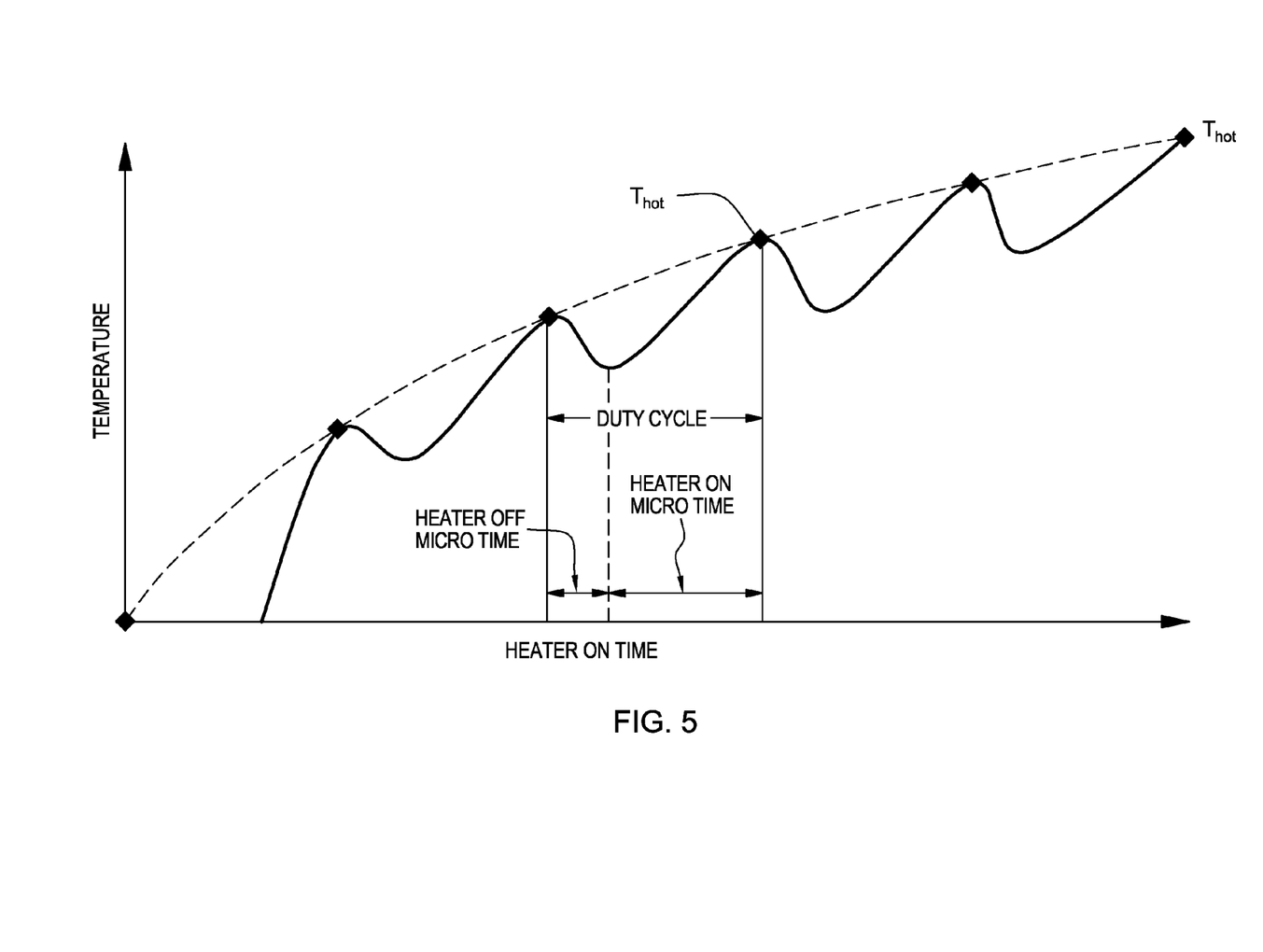
FIG. 5 graphically depicts sensor temperature versus heater time for an airflow sensor being powered using a set duty cycle, the duty cycle defining multiple sequential microcycles of powering the heater, in accordance with one or more aspects of the present invention.

FIG. 5 depicts one embodiment of a duty cycle which can be employed in powering a heater associated with a temperature sensor of an airflow sensor, such as described above in connection with FIG. 4. In this figure, temperature sensed versus heater ON time is illustrated. For purposes of explanation, the duty cycle is assumed to be a small, micro-time scale, such as 1,005 milliseconds. Heater ON micro-time refers to that portion of the duty cycle that the heater is powered, and heater OFF micro-time refers to that portion of the duty cycle that the heater is not powered. As one example, the duty cycle might comprise OFF for 30% and ON for 70%, and in a 1,005 millisecond duty cycle, this means the heater is OFF for approximately 300 milliseconds, and ON for approximately 700 milliseconds. By so controlling powering of the heater(s), the heat applied by the airflow sensor in the vicinity of the associated temperature sensor can be accurately controlled, thus providing better accuracy for the airflow sensing determinations described herein.

As noted, the difference between a hot temperature ($T_{hot}$) reading and an ambient temperature ($T_{amb}$) reading is proportional to the airflow across the airflow sensor. Using Newton's law of cooling, and assuming that the time scales are long enough to reach a steady state temperature, and that the airflow rate is sufficiently high that the heat transfer coefficient is only a function of airflow rate and geometry, heat dissipated from the heater(s) can be expressed as:

$$Q = hA(T_{hot} - T_{amb})$$

where Q is the heat dissipated from the heater, h is the heat transfer coefficient, A is the area being cooled, $T_{hot}$ is the temperature of the cooled surface, and $T_{amb}$ is the temperature of the ambient air. Since the readings are taken at two states, at two different heat transfer rates, then the temperature difference is inversely proportional to the heat transfer coefficient, and therefore, also the air velocity. Thus, since the heat transfer coefficient is driven by the air velocity over the cooled surfaces, the temperature difference between the hot reading and the ambient reading can be used to infer airflow velocity.

Figure 7A:
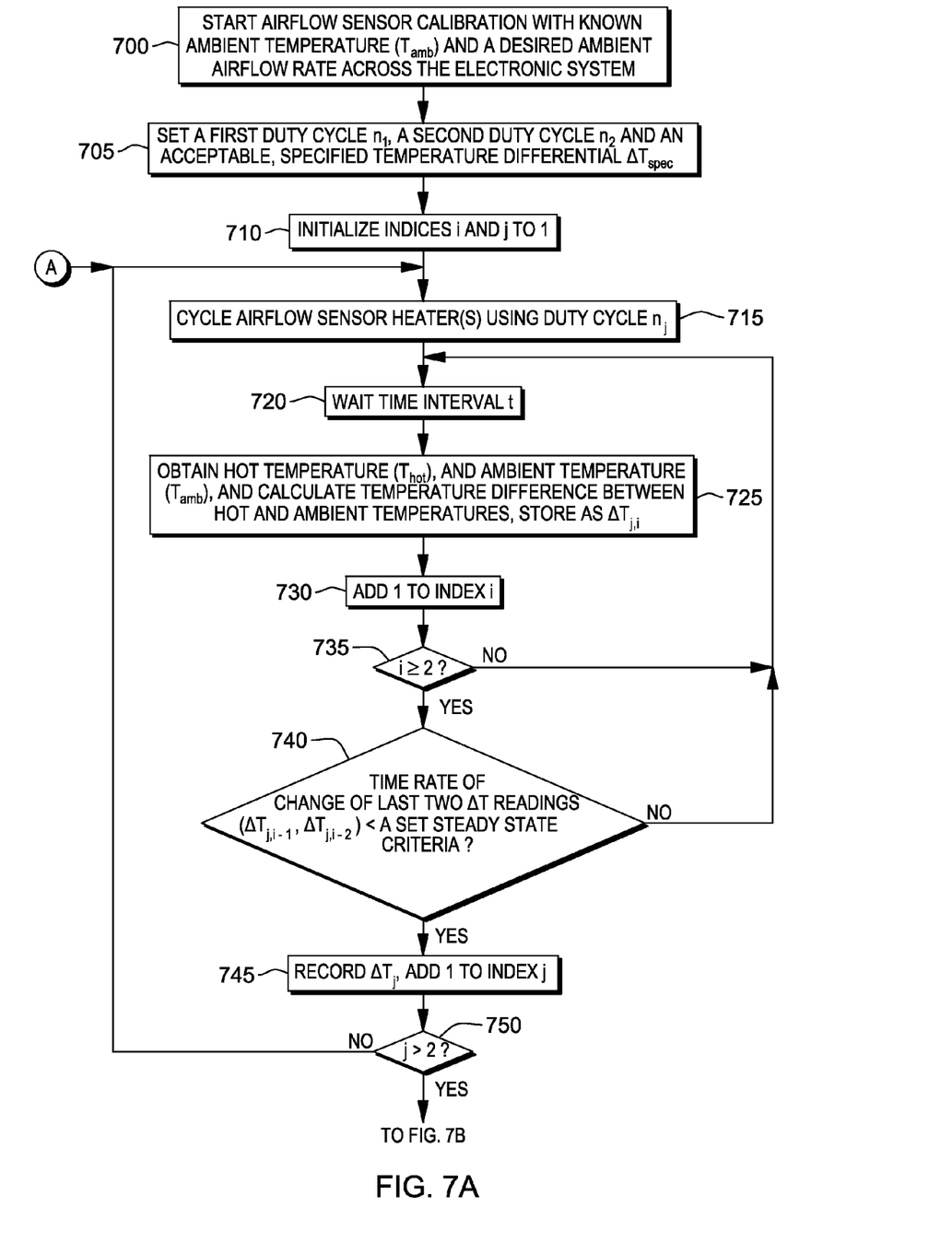
FIGS. 7A & 7B depict one embodiment of a process for calibrating an airflow sensor to facilitate monitoring airflow cooling, in accordance with one or more aspects of the present invention.
Figure 7B:
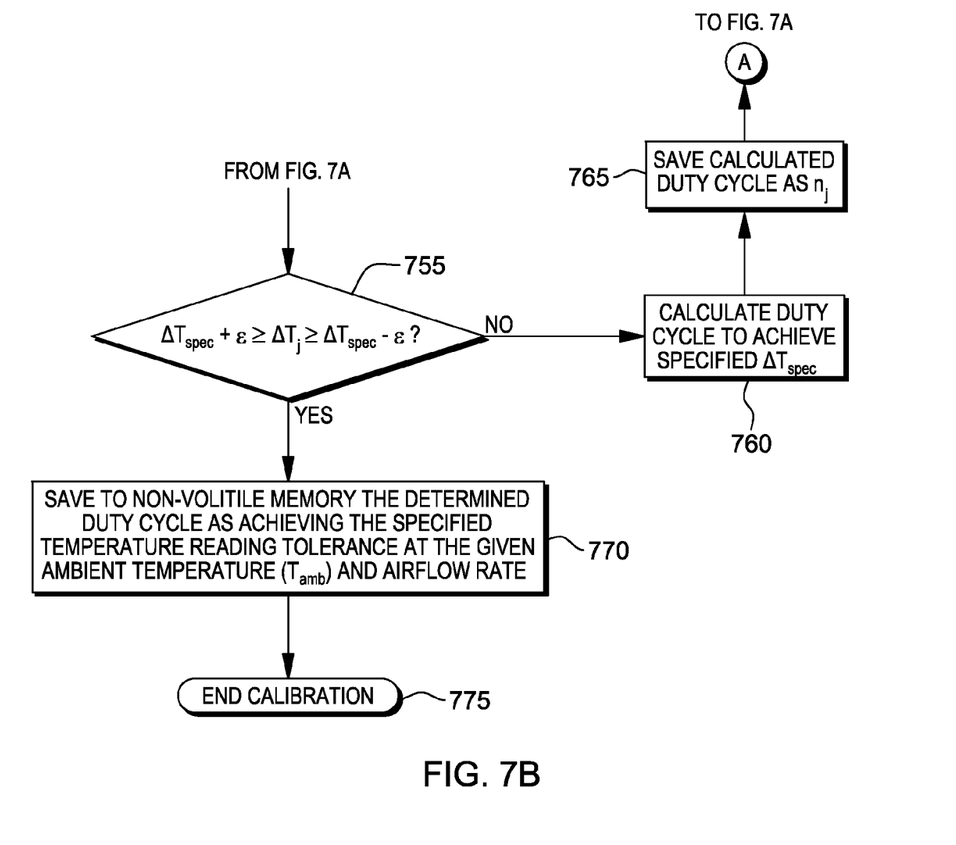

In FIG. 5 the dashed line indicates a continuous reading of the associated temperature sensor along the illustrated duty cycle. Described further below with reference to FIGS. 7A & 7B, is one method for calibrating a duty cycle of an airflow sensor comprising one or more resistive heaters and one or more temperature sensors (i.e., measurement devices), such as one or more thermistors. Additionally, disclosed herein is a monitoring approach using the airflow sensor with the calibrated duty cycle, which compares obtained temperature readings to one or more thresholds and which automatically initiates action to protect the electronic system from high temperature environments and/or low airflow conditions.

Figure 6:
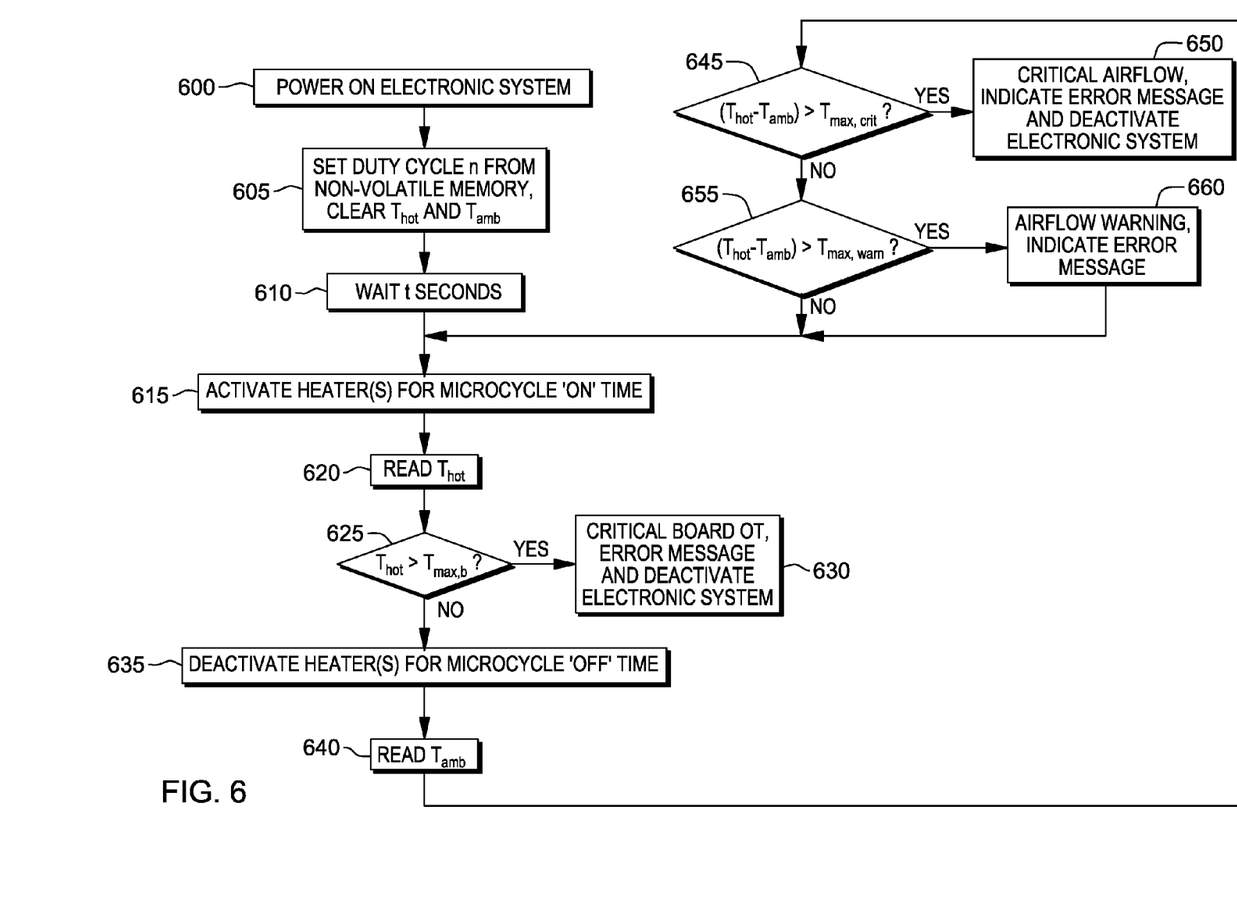
FIG. 6 depicts one embodiment of a process for monitoring airflow cooling of an electronic system, in accordance with one or more aspects of the present invention.

FIG. 6 depicts one embodiment of a process for monitoring cooling of an electronic system, in accordance with one or more aspects of the present invention. The process depicted in FIG. 6 employs one or more calibrated airflow sensors, such as described herein. Note that this processing is presented by way of example only.

After powering ON the electronic system 600, a calibrated duty cycle n is obtained, for example, from non-volatile memory, and the temperature readings $T_{hot}$ and $T_{amb}$ are cleared by the controller 605. Processing waits a time interval t 610 for temperature within the electronic system to stabilize after being powered on. The heater is activated for a period of time, calculated by multiplying the duty cycle n by a predetermined micro-cycle time interval, such as a 1005 millisecond interval 615.

A hot temperature ($T_{hot}$) reading is obtained 620, via one of the temperature sensors, and compared against a set maximum board threshold temperature ($T_{max,b}$) 625. The maximum board threshold temperature ($T_{max,b}$) corresponds to a temperature above which the board (or substrate) upon which the heater (e.g., resistor(s)) resides would be damaged, as read by the associated temperature sensor some distance away (see FIG. 4), and might be, by way of example, 95° C. If the hot temperature ($T_{hot}$) reading is above the maximum board threshold temperature ($T_{max,b}$) 625, then a critical board over temperature exists, and processing issues an error message and deactivates the electronic system 630.

Assuming that the hot temperature ($T_{hot}$) reading is below the maximum board threshold temperature ($T_{max,b}$), then the heater is deactivated for a period of time corresponding to the OFF portion of the duty cycle 635, and an ambient temperature ($T_{amb}$) reading 640 is obtained. Note that in the embodiment of FIG. 4, the ambient temperature reading is ascertained by a different temperature sensor (or thermistor) than that employed in obtaining the hot temperature ($T_{hot}$) reading. In an alternate embodiment, they could be the same temperature sensors.

The difference between the hot and ambient temperature ($T_{hot} - T_{amb}$) readings is then determined and compared against a low airflow critical limit ($T_{max,crit}$) 645, which corresponds to an airflow across the airflow sensor which is at or below the minimum airflow required for the system to ensure such that no components will be damaged. When the temperature difference ($T_{hot} - T_{amb}$) exceeds the low airflow critical limit ($T_{max,crit}$), processing issues a critical airflow error message, and deactivates the electronic system 650.

One of the constraints on the operation of the airflow sensor is that the temperature of the electronics board under the heater must not be damaged by excessive temperature. For example, if the electronics board under the airflow sensor has an operating limit of 130° C., corresponding to a 95° C. reading at the temperature sensor, then at the lowest valid airflow and hottest room temperature (corresponding to the highest operational thermistor temperature), the ambient temperature plus the acceptable temperature differential ($\Delta T_{spec}$) must be, for example, below 95° C. Since $\Delta T_{spec} = T_{hot} - T_{amb}$, if the product must operate at a 50° C. room, then if the airflow is equal to the airflow warning limit (i.e., lowest valid airflow), the resulting sensor temperature difference should be 95° C.−50° C.=45° C.=$\Delta T_{spec}$. Thus, 45° C. defines, in this example, the critical limit temperature ($T_{max,crit}$).

Assuming that the difference between the hot temperature and the ambient temperature ($T_{hot} - T_{amb}$) readings does not exceed the maximum critical temperature difference indicative of a low airflow, processing determines whether the temperature difference between the hot and ambient temperature ($T_{hot} - T_{amb}$) readings exceeds a low airflow warning limit temperature ($T_{max,warn}$), which corresponds to a temperature indicative of an airflow across the airflow sensor which is at or below the minimum airflow desired for the electronic system to be adequately cooled. In one example, this warning temperature threshold ($T_{max,warn}$) might be 50° C. If the above-noted critical temperature threshold ($T_{max,crit}$) is breached, an error message is sent and the electronic system is deactivated 650. However, if the warning temperature threshold ($T_{max,warn}$) is exceeded, then an error message is posted 660, but operation continues, and if no temperature thresholds are exceeded, then processing continues to cycle through the monitoring loop.

As described herein, the airflow sensor employed within the monitoring process is initially calibrated for the particular electronic system. In particular, depicted in FIGS. 7A & 7B is one approach to calibrating the duty cycle for powering the heater of the airflow sensor to ensure that the sensor does not indicate a low airflow when sufficient airflow exists, and to ensure that the airflow sensor indicates low airflow when the system/enclosure is at risk of overheating.

Referring initially to FIG. 7A, airflow sensor calibration begins with ascertaining a known ambient temperature and a desired ambient airflow rate across the electronic system 700. A first duty cycle $n_1$, and a second duty cycle $n_2$ are chosen or set, and an acceptable temperature differential ($\Delta T_{spec}$) is specified 705. The indexes i and j are initialized to 1 710, and the airflow sensor heater(s) is cycled using duty cycle $n_j$ 715. Processing waits a time interval t 720 for the temperature to stabilize, and reads (in one embodiment) the airflow sensor's first temperature sensor ($T_{hot}$), and second temperature sensor ($T_{amb}$), and calculates a temperature difference between the hot sensor and ambient temperatures ($T_{hot}-T_{amb}$), which is stored as $\Delta T_{j,i}$ 725. Next, "1" is added to index i 730, and a determination is made whether two or more temperature differences have been determined for the current duty cycle $n_j$ 735. If "no", then processing returns to wait time interval t 720 and repeat the process.

Once at least two temperature differences have been calculated, processing determines whether the time rate of change for the last two temperature readings ($\Delta T_{j,i-1}, \Delta T_{j,i-2}$) is less than a set steady state criteria 740. By way of example, the set steady state criteria might be 0.1° C./min. If "no", then processing returns to determine a next temperature difference between the hot temperature reading and ambient temperature reading ($T_{hot}-T_{amb}$). If "yes", then the time rate of change is recorded ($\Delta T_j$) for duty cycle $n_j$, and "1" is added to index j 745. Processing determines whether j is greater than two 750, and if "no", returns to cycle the airflow sensor heater using duty cycle $n_j$ to obtain another time rate of change reading ($\Delta T_j$) for another duty cycle $n_j$.

Referring to FIG. 7B, once j is greater than two, then processing compares the current temperature difference ($\Delta T_j$) to the specified temperature difference ($\Delta T_{spec}$) plus or minus a tolerance ($\epsilon$) band 755. If "no", then a duty cycle is calculated to achieve the specified temperature difference ($\Delta T_{spec}$) 760, and the calculated duty cycle is saved as duty cycle $n_j$ 765, after which processing returns to cycle the airflow sensor heater using duty cycle $n_j$ to obtain another time rate of change reading ($\Delta T_j$) for duty cycle $n_j$. Note that duty cycle $n_j$ can be calculated using:

$$n_j = \frac{(\Delta T_{spec} - \Delta T_{j-1})(n_{j-1} - n_{j-2})}{\Delta T_{j-1} - \Delta T_{j-2}} + n_{j-1}$$

If the current temperature difference ($\Delta T_j$) is within the specified temperature difference ($\Delta T_{spec}$) plus or minus the tolerance band 755, then processing saves to non-volatile memory the current duty cycle as achieving the specified temperature reading tolerance at the given ambient temperature and airflow rate 770, which completes calibration of the airflow sensor 775.

Those skilled in the art will note from the above description that disclosed herein is, in one aspect, a method of calibrating an airflow sensor within an electronic system/enclosure. In one embodiment, the airflow sensor includes one or more temperature sensors, one of which has associated therewith a varying power duty cycle such that the airflow rate through the electronic system can be inferred, and compared to one or more threshold values. Based on the comparison, speed of one or more air moving devices associated with the electronic system may be adjusted or power to the electronic system may be deactivated. As described herein, calibrating the duty cycle may include calculating a measured hot to ambient temperature difference for a first and second duty cycle, determining subsequent duty cycles using the measurements of the previous two duty cycles, converging upon a duty cycle which at a known airflow produces a desired temperature difference. The derived duty cycle is then saved to nonvolatile memory, for example, within the associated electronic system/enclosure, and subsequently used in operation of the airflow sensor so that despite differences between airflow sensors, low airflow and high ambient conditions can be identified without "fault trips".

As will be appreciated by one skilled in the art, control and/or calibration aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system". Furthermore, control and/or calibration aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable signal medium may be any non-transitory computer readable medium that is not a computer readable storage medium and that can communicate, propagate, or transport a program for use by or in connection with an instruction execution system, apparatus or device.

A computer readable storage medium may be, for example, but not limited to, an electronic, magnetic, optical, electromagnetic, infrared or semiconductor system, apparatus, or device, or any suitable combination of the foregoing. More specific examples (a non-exhaustive list) of the computer readable storage medium include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain or store a program for use by or in connection with an instruction execution system, apparatus, or device.

Figure 8:
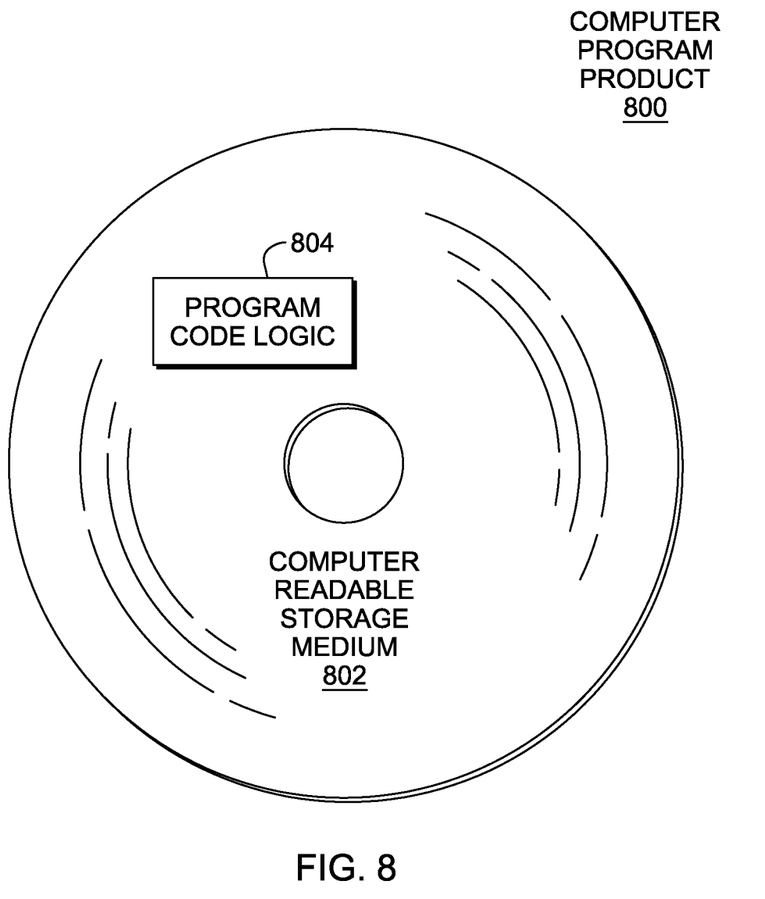
FIG. 8 depicts one embodiment of a computer program product or article of manufacture incorporating one or more aspects of the present invention.

Referring now to FIG. 8, in one example, a computer program product 800 includes, for instance, one or more computer readable storage media 802 to store computer readable program code means or logic 804 thereon to provide and facilitate one or more aspects of the present invention.

Program code embodied on a computer readable medium may be transmitted using an appropriate medium, including but not limited to wireless, wireline, optical fiber cable, RF, etc., or any suitable combination of the foregoing.

Computer program code for carrying out control and/or calibration operations for aspects of the present invention may be written in any combination of one or more programming languages, including an object oriented programming language, such as Java, Smalltalk, C++ or the like, and conventional procedural programming languages, such as the "C" programming language, assembler or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described herein with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

In addition to the above, one or more aspects of the present invention may be provided, offered, deployed, managed, serviced, etc. by a service provider who offers management of customer environments. For instance, the service provider can create, maintain, support, etc. computer code and/or a computer infrastructure that performs one or more aspects of the present invention for one or more customers. In return, the service provider may receive payment from the customer under a subscription and/or fee agreement, as examples. Additionally or alternatively, the service provider may receive payment from the sale of advertising content to one or more third parties.

In one aspect of the present invention, an application may be deployed for performing one or more aspects of the present invention. As one example, the deploying of an application comprises providing computer infrastructure operable to perform one or more aspects of the present invention.

As a further aspect of the present invention, a computing infrastructure may be deployed comprising integrating computer readable code into a computing system, in which the code in combination with the computing system is capable of performing one or more aspects of the present invention.

As yet a further aspect of the present invention, a process for integrating computing infrastructure comprising integrating computer readable code into a computer system may be provided. The computer system comprises a computer readable medium, in which the computer medium comprises one or more aspects of the present invention. The code in combination with the computer system is capable of performing one or more aspects of the present invention.

Although various embodiments are described above, these are only examples. For example, computing environments of other architectures can incorporate and use one or more aspects of the present invention. Additionally, the network of nodes can include additional nodes, and the nodes can be the same or different from those described herein. Also, many types of communications interfaces may be used.

Further, a data processing system suitable for storing and/or executing program code is usable that includes at least one processor coupled directly or indirectly to memory elements through a system bus. The memory elements include, for instance, local memory employed during actual execution of the program code, bulk storage, and cache memory which provide temporary storage of at least some program code in order to reduce the number of times code must be retrieved from bulk storage during execution.

Input/Output or I/O devices (including, but not limited to, keyboards, displays, pointing devices, DASD, tape, CDs, DVDs, thumb drives and other memory media, etc.) can be coupled to the system either directly or through intervening I/O controllers. Network adapters may also be coupled to the system to enable the data processing system to become coupled to other data processing systems or remote printers or storage devices through intervening private or public networks. Modems, cable modems, and Ethernet cards are just a few of the available types of network adapters.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form contain, such as "contains" and "containing") are open-ended linking verbs. As a result, a method or device that "comprises", "has", "includes" or "contains" one or more steps or elements possesses those one or more steps or elements, but is not limited to possessing only those one or more steps or elements. Likewise, a step of a method or an element of a device that "comprises", "has", "includes" or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to explain the principles of the invention and the practical application, and to enable others of ordinary skill in the art to understand the invention through various embodiments and the various modifications thereto which are dependent on the particular use contemplated.

What is claimed is:

1. A monitored electronic system comprising:
an electronic system at least partially air-cooled; and
a monitoring device for monitoring air-cooling of the electronic system, the monitoring device comprising:
   an airflow sensor positioned within the electronic system, the airflow sensor comprising at least one temperature sensor and a heater associated with one temperature sensor of the at least one temperature sensor, and the airflow sensor facilitating determining a rate of airflow within the electronic system;
   non-volatile memory containing a pre-calibrated ON-OFF duty cycle for use in powering the heater associated with the one temperature sensor of the at least one temperature sensor, the pre-calibrated ON-OFF duty cycle facilitating determining the rate of airflow within the electronic system using the airflow sensor from sensed temperature of the at least one temperature sensor, having been obtained with the airflow sensor positioned within the electronic system; and
   a controller, the controller using the pre-calibrated ON-OFF duty cycle in powering the heater associated with the one temperature sensor of the at least one temperature sensor during airflow monitoring of the electronic system and determining of the rate of airflow within the electronic system, and the controller obtaining a hot temperature ($T_{hot}$) reading from the one temperature sensor having the associated heater powered using the pre-calibrated ON-OFF duty cycle, and determining, based at least in part on the hot temperature ($T_{hot}$) reading, whether to issue a rate of airflow warning.

2. The monitored electronic system of claim 1, wherein the airflow sensor is positioned on an electronic board within the electronic system, and the controller is configured to determine whether the hot temperature ($T_{hot}$) reading is above a maximum acceptable board temperature ($T_{max,b}$), and responsive to the hot temperature ($T_{hot}$) reading being above the maximum acceptable board temperature ($T_{max,b}$), to issue a critical electronic board over temperature warning as the warning, and deactivate the electronic system.

3. The monitored electronic system of claim 1, wherein the controller is further configured to obtain an ambient temperature ($T_{amb}$) reading from the at least one temperature sensor to determine whether a difference between the hot temperature ($T_{hot}$) reading and the ambient temperature ($T_{amb}$) reading is above a critical temperature difference threshold ($T_{max,crit}$), and responsive to the difference between the hot temperature ($T_{hot}$) reading and the ambient temperature ($T_{amb}$) reading exceeding the critical hot temperature threshold ($T_{max,crit}$), to issue a critical airflow indication as the warning and to deactivate the electronic system.

4. The monitored electronic system of claim 1, wherein the controller is further configured to obtain an ambient temperature ($T_{amb}$) reading from the at least one temperature sensor, and to determine whether a difference between the hot temperature ($T_{hot}$) reading and the ambient temperature ($T_{amb}$) reading exceeds a warning temperature difference threshold ($T_{max,warn}$), and responsive to the difference between the hot temperature ($T_{hot}$) reading and the ambient temperature ($T_{amb}$) reading exceeding the warning temperature difference threshold ($T_{max,warn}$), to automatically issue an airflow warning indication as the warning.

5. The monitored electronic system of claim 1, wherein the controller is configured to obtain the pre-calibrated ON-OFF duty cycle from the non-volatile memory, the pre-calibrated ON-OFF duty cycle pre-determined by:
   (i) initiating airflow sensor calibration employing a known ambient temperature and a known ambient airflow rate across the electronic system;
   (ii) setting a first duty cycle $n_1$, a second duty cycle $n_2$, and an acceptable, specified temperature differential ($\Delta T_{spec}$);
   (iii) initializing an index i and an index j to 1;
   (iv) cycling powering of the heater using duty cycle $n_j$;
   (v) reading the one temperature sensor with the associated heater to obtain a hot temperature ($T_{hot}$) reading, and obtaining an ambient temperature ($T_{amb}$) reading from the at least one temperature sensor, and calculating a temperature difference between the hot temperature ($T_{hot}$) reading and the ambient temperature ($T_{amb}$) reading, and saving the temperature difference as $\Delta T_{j,i}$;
   (vi) adding 1 to index i;
   (vii) determining whether the time rate of change over the last two temperature difference readings ($\Delta T_{j,i-1}, \Delta T_{j,i-2}$) is less than a set steady state criteria, and responsive to the time rate of change over the last two temperature difference readings not being below the set steady state criteria, returning to obtain another hot temperature ($T_{hot}$) reading and another ambient temperature ($T_{amb}$) reading, otherwise, recording the temperature difference ($\Delta T_j$), and add 1 to index j;
   viii) determining whether the current temperature difference ($\Delta T_j$) is at the specified temperature difference ($\Delta T_{spec}$) plus or minus a tolerance band; and
   (ix) responsive to the determined temperature difference ($\Delta T_j$) being at the specified temperature difference ($\Delta T_{spec}$) plus or minus the tolerance band, saving the current duty cycle $n_j$ as the pre-calibrated ON-OFF duty cycle, the pre-calibrated ON-OFF duty cycle facilitating obtaining the acceptable, specified temperature difference.

6. A system comprising:
an electronic system at least partially air-cooled;
a monitoring device for monitoring air-cooling of the electronic system, the monitoring device comprising:
   an airflow sensor positioned within the electronic system, the airflow sensor comprising at least one temperature sensor and a heater associated with one temperature sensor of the at least one temperature sensor, and the airflow sensor facilitating determining a rate of airflow within the electronic system;

non-volatile memory containing a pre-calibrated ON-OFF duty cycle for use in powering the heater associated with the one temperature sensor of the at least one temperature sensor, the pre-calibrated ON-OFF duty cycle facilitating determining the rate of airflow within the electronic system using the airflow sensor from sensed temperature of the at least one temperature sensor having been obtained with the airflow sensor positioned within the electronic system, and ensuring that the airflow sensor indicates low airflow when the electronic system is at risk of overheating; and a controller, the controller using the pre-calibrated ON-OFF duty cycle in powering the heater associated with the one temperature sensor of the at least one temperature sensor during airflow monitoring of the electronic system and determining of the rate of airflow within the electronic system, and the controller obtaining a hot temperature ($T_{hot}$) reading from the one temperature sensor having the associated heater powered using the pre-calibrated ON-OFF duty cycle, and determining, based at least in part on the hot temperature ($T_{hot}$) reading, whether to issue an airflow warning;

a calibration system used to pre-determine the pre-calibrated ON-OFF duty cycle, the calibration system comprising a processor which facilitates, at least in part:

(i) initiating airflow sensor calibration employing a known ambient temperature and a known ambient airflow rate across the electronic system;

(ii) setting a first duty cycle $n_1$, a second duty cycle $n_2$, and an acceptable, specified temperature differential ($\Delta T_{spec}$);

(iii) initializing an index i and an index j to 1;

(iv) cycling powering of the heater using duty cycle $n_j$;

(v) reading the one temperature sensor with the associated heater to obtain a hot temperature ($T_{hot}$) reading, and obtaining an ambient temperature ($T_{amb}$) reading from the at least one temperature sensor, and calculating a temperature difference between the hot temperature ($T_{hot}$) reading and the ambient temperature ($T_{amb}$) reading, and saving the temperature difference as $\Delta T_{j,i}$;

(vi) adding 1 to index i;

(vii) determining whether the time rate of change over the last two temperature difference readings ($\Delta T_{j,i-1}$, $\Delta T_{j,i-2}$) is less than a set steady state criteria, and responsive to the time rate of change over the last two temperature difference readings not being below the set steady state criteria, returning to obtain another hot temperature ($T_{hot}$) reading and another ambient temperature ($T_{amb}$) reading, otherwise, recording the temperature difference ($\Delta T_j$), and add 1 to index j;

(viii) determining whether the current temperature difference ($\Delta T_j$) is at the specified temperature difference ($\Delta T_{spec}$) plus or minus a tolerance band; and (ix) responsive to the determined temperature difference ($\Delta T_j$) being at the specified temperature difference ($\Delta T_{spec}$) plus or minus the tolerance band, saving the current duty cycle $n_j$ as the pre-calibrated ON-OFF duty cycle, the pre-calibrated ON-OFF duty cycle facilitating obtaining the acceptable, specified temperature difference.

* * * * *